(12) United States Patent
Barbier et al.

(10) Patent No.: US 6,350,950 B1
(45) Date of Patent: Feb. 26, 2002

(54) ELECTRONIC PLUG-IN UNIT WHICH INCLUDES AN IMPROVED HEAT-DISSIPATION DEVICE

(75) Inventors: Jean-Paul Barbier, Notre Dame de Bondeville; Bernard Eveillard, Paris; Dominique Feral, Bois-Guillaume; Marc Fontchastagner, Mont Saint Aignan, all of (FR)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/445,272

(22) PCT Filed: May 28, 1998

(86) PCT No.: PCT/EP98/03434

§ 371 Date: Mar. 14, 2000

§ 102(e) Date: Mar. 14, 2000

(87) PCT Pub. No.: WO98/56222

PCT Pub. Date: Dec. 10, 1998

(30) Foreign Application Priority Data

Jun. 4, 1997 (FR) .............................................. 97 06891

(51) Int. Cl.⁷ .............................. H02G 3/08; H05K 5/00
(52) U.S. Cl. ...................... 174/52.1; 361/707; 361/709; 361/710; 361/711; 361/720; 361/831
(58) Field of Search ................................ 361/831, 715, 361/702, 704, 707, 709, 710, 711, 720; 174/16.3, 52.1; 165/80.2, 80.3; 257/712

(56) References Cited

U.S. PATENT DOCUMENTS 4,587,593 A    5/1986   Liautaud et al. ............. 361/690
5,101,322 A  * 3/1992   Ghaem et al. ............... 361/715

FOREIGN PATENT DOCUMENTS

JP         07045980      2/1995    ............ H05K/7/20
WO    WO 85 03836 A     8/1985    ............ H05K/7/14

OTHER PUBLICATIONS

International Search Report, dated Oct. 14, 1998.

* cited by examiner

*Primary Examiner*—Dean A. Reichard
*Assistant Examiner*—Hung V Ngo

(57) ABSTRACT

The invention relates to an electronic plug-in unit which has two lateral edges and adapted to support at least one electronic card. The plug-in unit includes a central core made of metal lying parallel to the plane of the plug-in unit and a supported electronic card to drain away heat, by thermal conduction, to at least one lateral radiator which forms one of the lateral edges of the plug-in unit.

11 Claims, 3 Drawing Sheets

ELECTRONIC PLUG-IN UNIT WHICH INCLUDES AN IMPROVED HEAT-DISSIPATION DEVICE

CROSS-REFERENCE TO RELATED APPLICATION

This application claims priority of French Application No. 9706891, which was filed on Jun. 4, 1997, and PCT Application No. PCT/EP98/03434, which was filed on May 28, 1998.

BACKGROUND OF THE INVENTION

1. Field of the Invention

The invention relates to an electronic plug-in unit which includes an improved heat-dissipation device.

2. Description of the Prior Art

There are many uses of electronic plug-in units. One application consists, for example, in using them to produce radiotelephone links in a rural environment within the context of mobile telephony. This type of link thus makes it possible to avoid the costly laying of cables in order to link two points which are isolated and/or difficult to access.

Such electronic plug-in units make it possible to produce between two and sixteen 2-megabit telephone links. of course, the application mentioned is merely one example, electronic plug-in units being in fact intended for many uses which depend, in particular, on the nature of the electronic cards which they contain.

An electronic plug-in unit generally comprises several specific electronic cards which are linked via connection pins, on the one hand, to related electronic modules and, on the other hand, to external electronic modules which themselves are linked to an external antenna so as to be able to transmit and/or receive information via radio waves, for example. Each card supports components such as integrated circuits, for example, which have the drawback of generating heat. To allow proper operation of the electronic cards contained in the plug-in unit, it is therefore necessary to dissipate this heat generated by the heating components and to remove it to the outside.

A known solution consists in placing a fan inside the electronic plug-in unit. However, this solution cannot be envisaged as the presence of a fan involves very frequent maintenance operations, especially for cleaning or changing the fan's filters. In point of fact, the electronic plug-in units are intended to be distributed in large numbers and to be installed in isolated places access to which is sometimes difficult. It is therefore impossible to envisage carrying out very frequent maintenance operations. Moreover, the addition of such a fan results in a significant reduction in the MTBF (mean time before failure) of the plug-in unit which, for example, drops from 8 years to 2 years, approximately. This solution is therefore inconceivable.

Currently, the heating components are thermally coupled to commercial heat sinks. These heat sinks are therefore preferably placed either on the edges of the electronic cards or on a side edge of the plug-in unit into which the electronic cards are inserted. Consequently, the heat dissipation is improved. Moreover, the electronic cards must be placed in the plug-in unit, along slides, in such a way that these cards are sufficiently far apart for natural convection to be able to occur. The distance between the cards may be about 10 centimeters. In addition, the plug-in unit is necessarily aerated, by means of small apertures made in its walls, so as to allow the heat to be removed to the outside by natural ventilation.

Moreover, when several electronic plug-in units are placed in an integrating rack, they must necessarily be spaced sufficiently far apart to allow the internal heat to be removed through their apertures by convection and natural ventilation. This distance between the plug-in units is typically between 20 and 40 centimeters, approximately.

Current plug-in units are therefore very bulky since they have a thickness which is generally greater than 8 cm, and they result in a waste of space in the integrating racks since they cannot be stacked one on top of another.

Furthermore, the constraint of placing the heating components along the edges is sometimes not readily compatible with the architecture of an electronic card to be produced.

SUMMARY OF THE INVENTION

The present invention solves the aforementioned problems by providing a thin electronic plug-in unit which includes a central core capable of draining away, by thermal conduction, the heat generated by the heating components located on the electronic cards.

The electronic plug-in unit includes a solid central core made of metal lying parallel to the plane of the plug-in unit in a position intermediate between two layers of electronic cards, so as to drain away heat, by thermal conduction, to at least one lateral radiator forming one of the said lateral edges of the plug-in unit. It is very compact with a small thickness, typically less than 10 cm. The central core, forming a heat sink, makes it possible not only to improve the heat dissipation of the plug-in unit, by the effect of thermal conduction to the lateral radiators, but also to ensure good mechanical integrity of the plug-in unit since the electronic cards and the top and bottom covers, intended to close off the plug-in unit, are directly fixed to this heat sink. In addition, the top and bottom covers of the plug-in unit do not necessarily have apertures since the heat is dissipated laterally to the outside by thermal conduction, and not by convection, which is associated with natural ventilation. When they do not have apertures, the covers of the plugin unit allow it to be hermetically protected from external attack. Furthermore, since the heat is no longer removed to the outside by natural ventilation, several plug-in units can be stacked one on top of another in an integrating rack, which saves space.

DETAILED DESCRIPTION OF THE INVENTION

Figure 1:
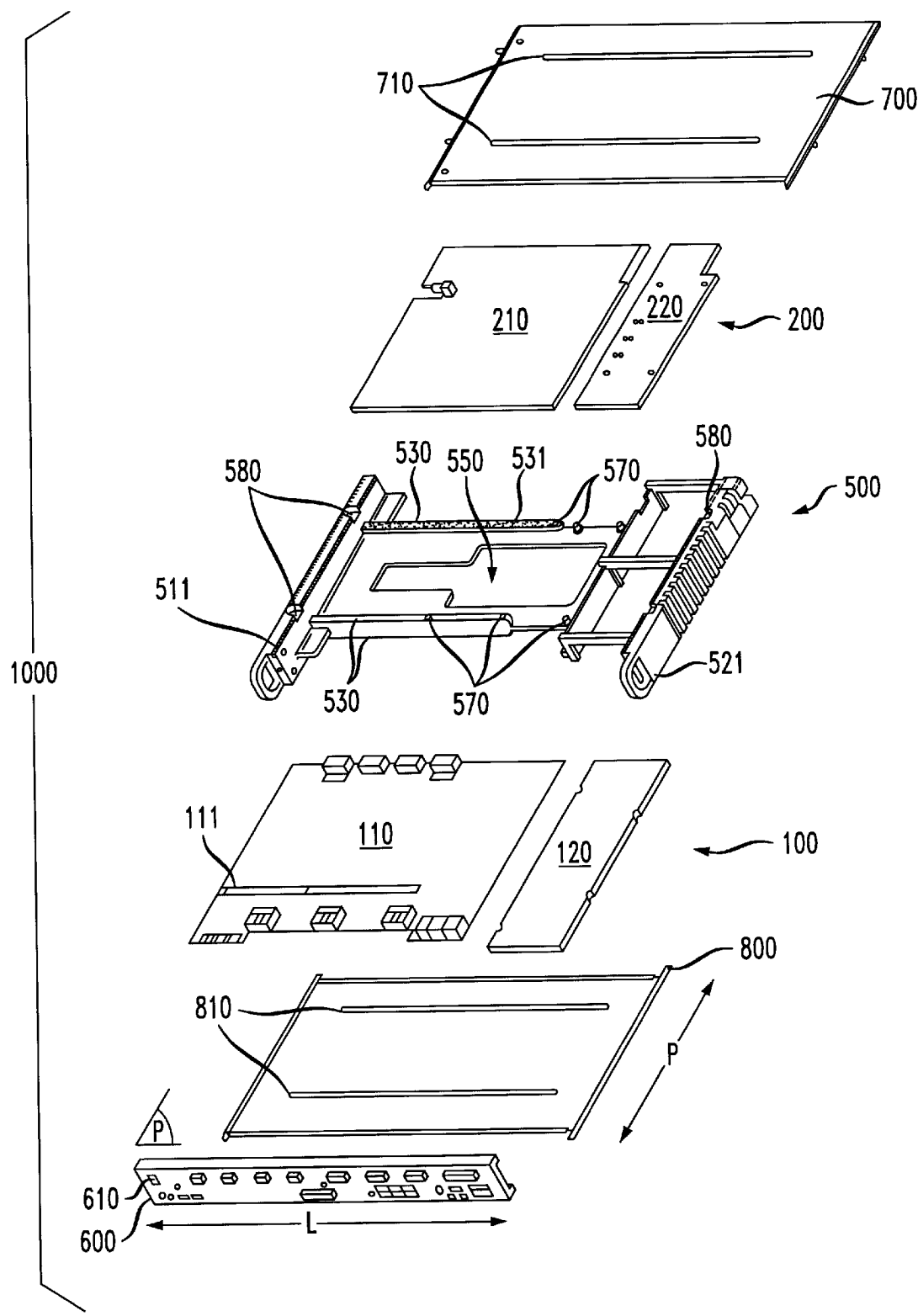
FIG. 1 is an exploded view of an electronic plug-in unit according to the invention.

An electronic plug-in unit according to the invention is denoted by the general reference 1000 in FIG. 1. In the example illustrated in this figure, the electronic plug-in unit is intended to be used in the context of mobile telephony installations but, of course, the invention is not limited to such an application. It includes four electronic cards: a multiplexer card 110 capable of providing sixteen 2-megabit links from four 2-megabit links, a supply converter card 120, a modem card 210 and a network card 220 for managing the organization of the information contained in the various cards. These electronic cards are illustrated diagrammatically in FIG. 1 by rectangles without any electronic components. Of course, the number of electronic cards and their nature may be different, depending on the application for which the electronic plug-in unit is intended.

The electronic plug-in unit 1000 furthermore has a solid central core labelled 500 in FIG. 1. This central core 500, or heat sink, lies parallel to the plane P of the plug-in unit and in a position intermediate between two layers 100 and 200 of electronic cards. This is because it lies above a layer 100 which includes the multiplexer card 110 and the converter card 120 and below a layer 200 which includes the modem card 210 and the network card 220.

This central core 500 is preferably made of metal in order for the heat generated by the heating components, located on the electronic cards, to be thermally conducted to at least one lateral radiator 511, 521 which itself forms one of the lateral edges of the plug-in unit. The lateral radiators 511 and 521 have a surface in contact with the outside, and therefore remove the heat to the outside.

The distance between the two lateral radiators 511, 521 defines the width L of the plug-in unit according to the invention. This width is about 48 cm. The thickness of these radiators defines the thickness, or the height, of the plug-in unit. This thickness is about 4.4 cm. Finally, the length of these radiators defines the depth p of the plug-in unit. This depth is about 24 cm.

At least two rails 530 are provided, formed by an additional thickness, along the longitudinal edges of at least one of the bottom and/or top faces of the heat sink 500. The heat sink shown in FIG. 1 has four rails 530. At least one of these rails 530 is intended to adhere to at least one track made on one face of an electronic card so as to establish thermal contact and to remove the heat that has built up on this card. A track 111 is illustrated on the multiplexer card 110 of FIG. 1.

When a single rail 530 allows thermal contact with an electronic card to be established, the second rail keeps the electronic cards in a horizontal plane, parallel to the plane P of the plug-in unit.

In an alternative embodiment, it is conceivable to place a thermally conducting but electrically insulating foam on at least one rail 530. Thus, the foam 531 makes it possible both to remove the heat that has built up on the electronic card and to protect this electronic card from parasitic currents which are, for example, liable to produce operating faults, or even short-circuits.

The heat sink 500 of the plug-in unit 1000 according to the invention also has several threaded holes 570 which are intended to receive screws for fixing the various electronic cards 110, 120, 210, 220 to this heat sink. Other threaded holes 580 are furthermore provided on the top and bottom walls of the lateral radiators 511 and 521 in order to be able to fix, by screwing, a top cover 700 and a bottom cover 800, respectively. Thus, a second function of the central core 500 of the plug-in unit consists in holding the electronic cards 110, 120, 210, 220 and the top and bottom covers 700, 800 of the plug-in unit 1000 in place. The central core 500 consequently constitutes the framework of the electronic plug-in unit.

The bottom cover 800 and top cover 700 are provided, respectively, with one or more stiffeners 810, 710 intended to reinforce their mechanical integrity. Advantageously, these covers furthermore allow the electronic cards to be protected from external attack, such as rain or electromagnetic radiation, for example.

In an alternative embodiment, a few apertures may optionally be provided on the covers 700, 800 in order to allow some dissipation by convection and natural ventilation, even if this remains very small.

The front panel 600 of the plug-in unit 1000 comprises an interconnection card consisting of several sockets. Some of the sockets are intended for connecting coaxial cables and other sockets are in the form of plug-in connectors. Another specific connector 610 is furthermore provided for connecting an external antenna. All the sockets on the front panel 600 are linked to the multiplexer card 110 so as to connect the latter to external electronic modules. As regards the external antenna, this is linked to the external modules which are themselves linked to the modem card 210 via the connector 610. The multiplexer card 110 is also linked to the other electronic cards 120, 210, 220 in order to communicate with them.

Of course, in an alternative embodiment, it would be possible to install a motherboard on the front panel 600 of the plug-in unit so as to interconnect all the electronic cards 110, 120, 210, 220 and to link this motherboard to external electronic modules via external connection terminals.

Figure 2:
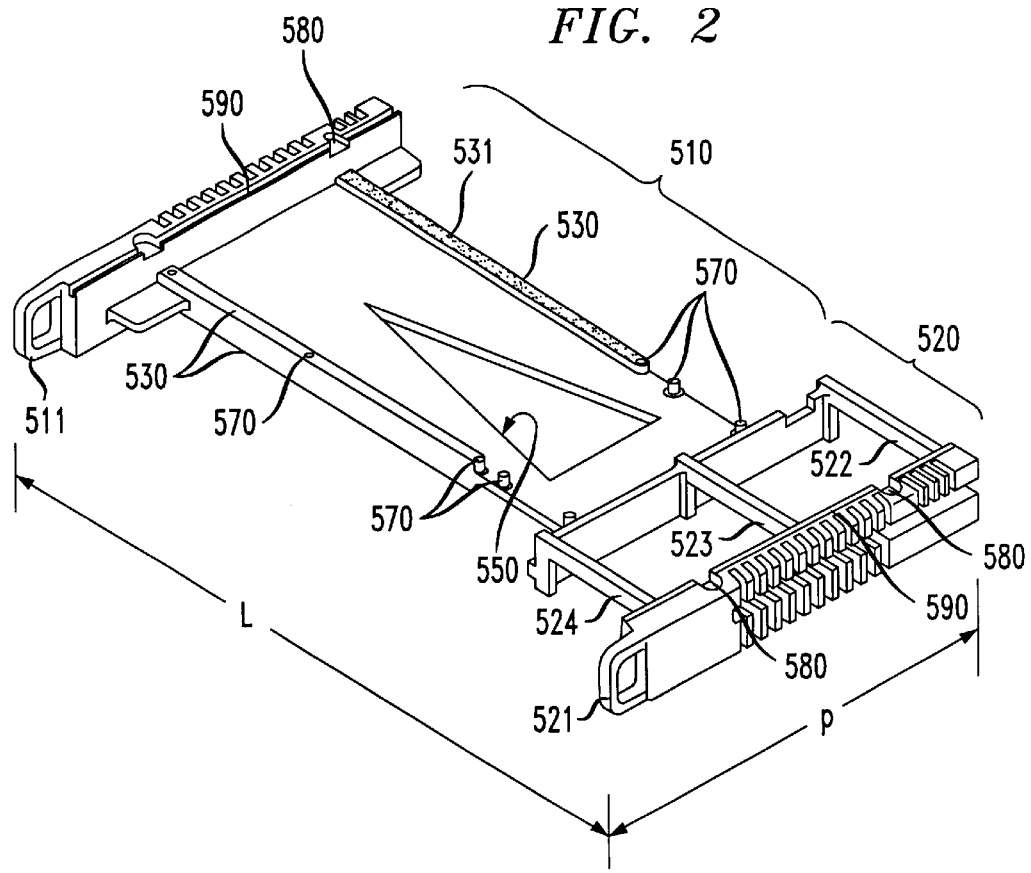
FIG. 2 is a perspective view of a central core capable of being placed inside the electronic plug-in unit of FIG. 1.

FIG. 2 illustrates a perspective view of one embodiment of the central core 500 of the electronic plug-in unit according to the invention. The same labels are used to denote the same components as in FIG. 1.

The heat sink 500 has two parts called, respectively, the "converter part" 520 and the "frame part" 510. The converter part 520 is wider than the frame part 510. This converter part 520 is intended to cover the converter card 120 of FIG. 1. As regards the frame part 510, this is placed in a position intermediate between the two layers of electronic cards since it covers the multiplexer card 110, on the one hand, and supports the modem card 210 and network card 220, on the other hand.

Advantageously, the frame part 510 allows heat dissipation by a thermal conduction effect. To do this, the heat sink 500 presents a linear increase in the mass of metal when one moves along it from a mid-position to the first lateral radiator 511. This increase in the mass of metal makes it possible, in particular, to create a thermal conduction gradient between the first lateral radiator 511 and the interface lying between the frame part 510 and the converter part 520. Such a thermal conduction gradient allows the heat to drain away to the coldest parts. In the present case, the heat drains away to the lateral radiator 511 so that it can then be removed to the outside. To do this, the amount of metal must therefore be greater near the radiator 511. This is because, the greater the mass of metal, the greater the thermal conduction becomes. Thus, the frame part 510 of the central core 500 makes it possible to drain away the heat generated by the heating components on the multiplexer card 110, modem card 210 and network card 220 to the first lateral radiator 511.

To achieve this increase in the mass of metal, a generally triangular cavity 550 is made in the frame part 510, as illustrated in FIG. 2. This cavity is produced in such a way that the apex of the triangle is directed towards the first lateral radiator 511. Since the cavity is narrower at the apex of the triangle, the amount of metal is therefore greater in the portion lying near the radiator 511.

Figure 3:
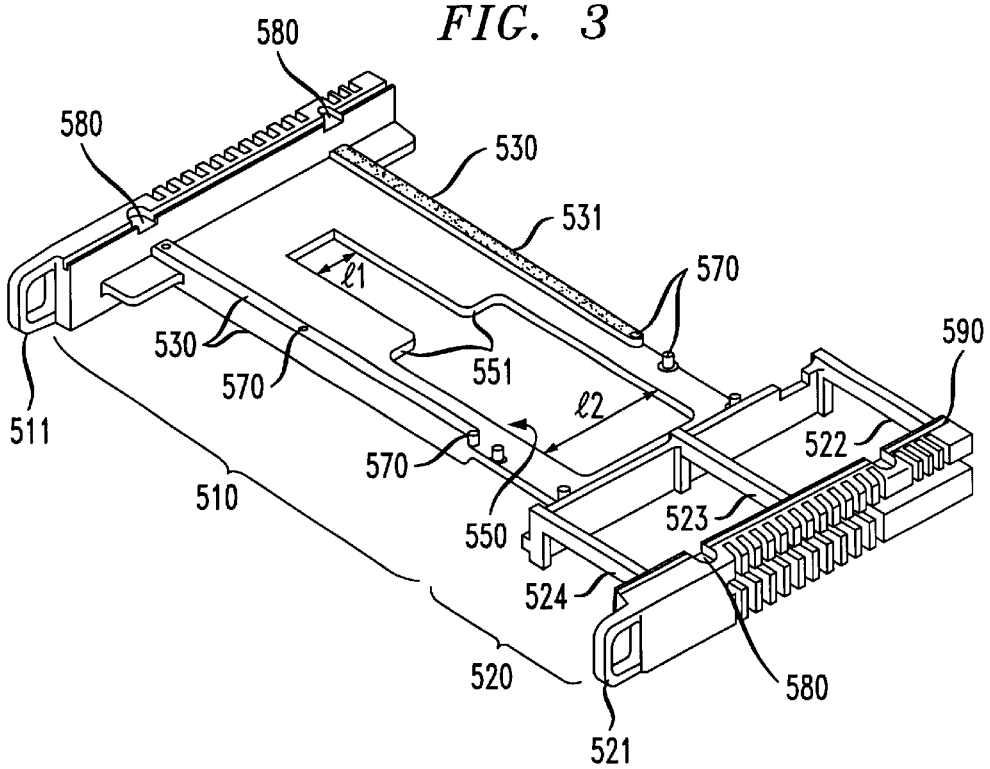
FIG. 3 is a perspective view of a central core according to an alternative embodiment.

In an embodiment illustrated in FIGS. 1 and 3, this cavity 550 may also be approximately rectangular in shape. In this case, the cavity has at least one step 551 so that it has at least one narrower portion 552 on the side facing the first lateral radiator 511. Thus, the end 552 of the cavity 550 lying near the first lateral radiator 511 has a width 11 which is less than the width 12 of the opposite end lying near the interface between the frame part 510 and the converter part 520.

The fact of producing a cavity 550 in the central core 500 is advantageous because this cavity makes it possible to reduce the quantities of metal used and consequently to reduce not only the cost but also the weight of the electronic plug-in unit into which the core 500 is inserted. Moreover, when there is no cavity it is not possible to create a sufficient thermal conduction gradient so that the heat drains away less effectively and takes place independently, towards both lateral radiators.

Figure 4:
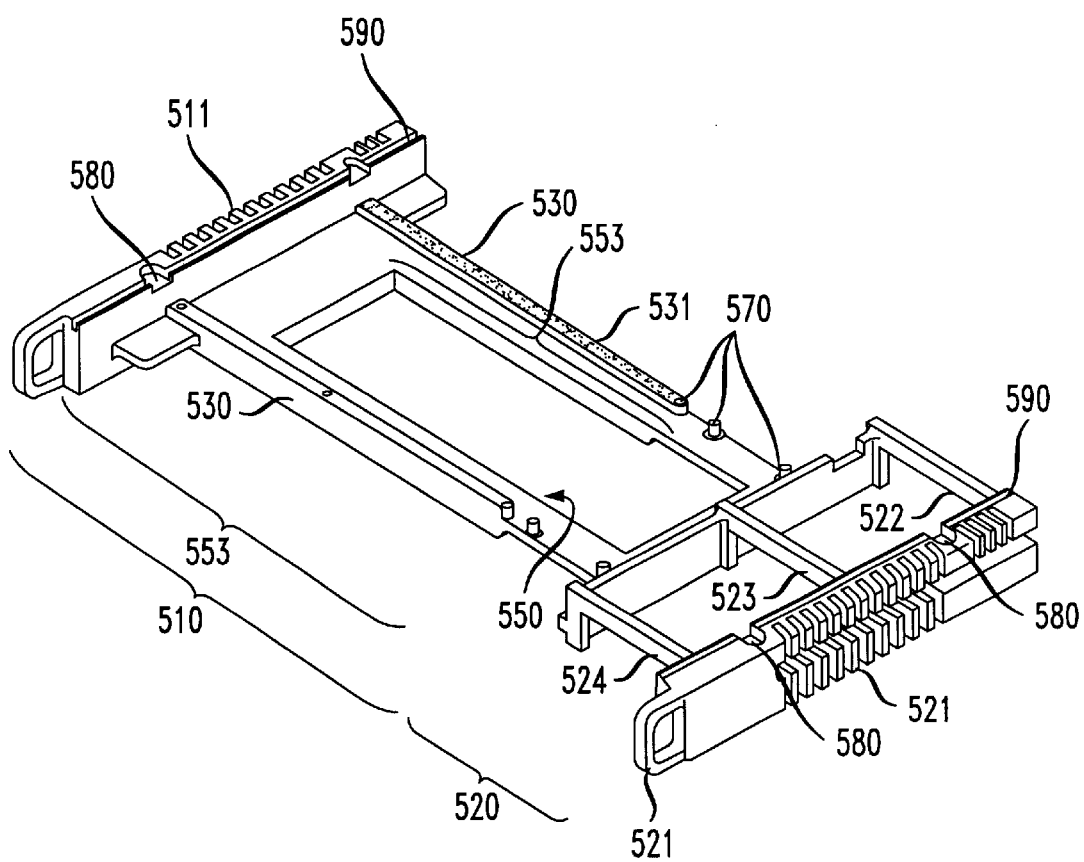
FIG. 4 is a perspective view of a central core according to another alternative embodiment.

In another embodiment, it is also possible to envisage increasing the mass of metal by increasing the thickness of the frame part 510 of the heat sink 500, the thickest portion 553 lying near the first lateral radiator 511. In this case, it is preferable for the frame part 510 of the heat sink 500 also to have a cavity, for the cost and weight reasons explained previously. This cavity is approximately rectangular. This variant is illustrated in the perspective shown in FIG. 4.

With regard to the converter part 520, this has three branches 522, 523, 524 which are connected to the top of a second lateral radiator 521. The heat generated by the electronic components on the converter card lying beneath this converter part 520 is removed in a conventional manner, by connecting the heat-generating electronic components to the internal wall of the second lateral radiator 521 via a metal piece, not illustrated in FIGS. 1 to 4.

Consequently, whereas the first frame part 510 drains heat away to the first lateral radiator 511, in order to allow the heat to be removed in the first direction, the second converter part 520, which has no central core, allows heat to be removed to the second lateral radiator 521 in the opposite direction to the first.

Preferably, the non-cavitied parts of the central core 500 are in superposition with the heating components on the electronic cards so as to optimize the thermal conduction effect.

The heat sink 500 and the lateral radiators 511, 521 are made as a single casting.

The metal from which the heat sink 500 is made must be a good thermal conductor. Thus, the heat sink may be made, for example, of copper, bronze or aluminium. The preferred metal for making the heat sink 500 is aluminium.

The aluminium is melted and poured into a mould. However, this metal is known to shrink as it cools. Consequently, the dimensions of the mould are designed so that the finished heat sink has the desired dimensions. The mould thus has dimensions which are 4 mm greater than those of the finished heat sink 500. After the aluminium heat sink has cooled and has been removed from the mould, it is then tapped by means of a tool such as, for example, a hammer.

In one embodiment, when the production rate is high, it is conceivable to make two different pieces separately: on the one hand, the central part of the heat sink 500, i.e. the frame part 510 and the converter part 520, and, on the other hand, the lateral part of the heat sink, i.e. the lateral radiators 511, 521 which are identical.

Moreover, the surfaces of the rails and of the internal walls of the lateral radiators are ground flat, for example by means of a grinding wheel or a milling machine, so as to produce good contacts with, respectively, the tracks on the electronic cards and the metal pieces provided for connecting the heating components on the converter card to the lateral radiator 521.

Grooves 590 are provided in the upper and lower walls of the two lateral radiators 511, 521. These grooves are intended for sliding on the top and bottom covers of the plug-in unit, respectively, which are then fixed to the radiators 511, 521 by screws.

The thickness of the lateral radiators, i.e. the thickness of the electronic plug-in unit according to the invention, is less than 10 cm. In general, it is at least equal to 44 mm and the distance between the two layers of electronic cards is between 15 and 20 mm.

The plug-in unit according to the invention which has just been described makes it possible to dissipate powers of about 15 to 20 watts, i.e. temperature rises of between 15 and 20° C. with respect to the normal operating temperature, which is about 55° C.

On the other hand, if the power increases and reaches a value of about 30 watts, because of the use of a larger number of heating components on the electronic cards for example, it will be necessary to increase the thickness of the plug-in unit so that the heat is distributed over a larger volume. This thickness is then multiplied by n, n being an integer greater than or equal to 2. In addition, in this case the lateral radiators are thicker and consequently have a greater area of contact with the outside, so that a more effective removal of the heat to the outside is ensured.

What is claimed is:

1. An electronic plug-in unit having two lateral edges and adapted to support at least one electronic card comprising a central core of metal lying parallel to the plane of the electronic card to drain away heat by thermal conduction from the electronic card supported thereon to a first lateral radiator which forms one of the lateral edges of the plug-in unit wherein the mass of metal of the central core increases from a mid-position to the first lateral radiator.

2. The plug-in unit of claim 1, wherein the central core has a generally triangular cavity, the apex of the triangular cavity being directed towards the first lateral radiator.

3. The plug-in unit of claim 2, wherein the cavity is stepped to form a more narrow portion on an end which faces the first lateral radiator.

4. The plug-in unit of claim 3, wherein a non-cavity part of the central core is adapted to be in superposition with heating components on the electronic card supported by the plug-in unit.

5. The plug-in unit of claim 4, wherein the thickness of the central core varies, the thickest portion being located near the first lateral radiator.

6. The plug-in unit of claim 5, comprising a first part for draining away heat to the first lateral radiator in a first direction, and a second part which has no solid central core for transferring heat to a second lateral radiator in the opposite direction to the first part.

7. The plug-in unit of claim 6, wherein the central core and one of the lateral radiators is a single casting of aluminum.

8. The plug-in unit of claim 7, wherein the central core has at least two rails formed by an additional thickness, at least one of the rails is adapted to be in contact with a track on the supported electronic card to remove heat from the electronic card.

9. The plug-in unit of claim 8, wherein a thermally conducting and electrically insulating film is supported by at least one of the rails.

10. The plug-in unit of claim 9, wherein the central core supports threaded openings for receiving screws adapted to secure the electronic card in addition to at least one cover to the central core.

11. The plug-in unit of claim 10, comprising a front panel having sockets for coupling the electronic card to external electronic modules.

* * * * *